(12) United States Patent
Pelissier et al.

(10) Patent No.: US 10,020,930 B2
(45) Date of Patent: Jul. 10, 2018

(54) METHOD OF NON-UNIFORM WAVELET BANDPASS SAMPLING

(71) Applicants: Commissariat A L'Energie Atomique et aux Energies Alternatives, Paris (FR); Cornell University, Ithaca, NY (US)

(72) Inventors: Michael Pelissier, Grenoble (FR); Christoph Emanuel Studer, Ithaca, NY (US)

(73) Assignees: COMMISSARIAT A L'ENERGIE ATOMIQUE ET AUX ENERGIES ALTERNATIVES, Paris (FR); Cornell University, Ithaca, NY (US)

( * ) Notice: Subject to any disclaimer, the term of this patent is extended or adjusted under 35 U.S.C. 154(b) by 0 days.

(21) Appl. No.: 15/343,613

(22) Filed: Nov. 4, 2016

(65) Prior Publication Data
US 2018/0131504 A1   May 10, 2018

(51) Int. Cl.
*H04L 27/00* (2006.01)
*H04L 7/00* (2006.01)
*H04L 12/12* (2006.01)
*H04L 27/12* (2006.01)

(52) U.S. Cl.
CPC ............ *H04L 7/0016* (2013.01); *H04L 12/12* (2013.01); *H04L 27/0004* (2013.01); *H04L 27/12* (2013.01)

(58) Field of Classification Search
CPC . H04L 27/0004; H04N 19/60; H04B 1/71637
See application file for complete search history.

(56) References Cited

U.S. PATENT DOCUMENTS

| 8,804,811 B2* | 8/2014 | Muqaibel | H04B 1/71637 |
| | | | 375/239 |
| 9,660,693 B1* | 5/2017 | Ni | H04B 1/715 |
| 2010/0241378 A1* | 9/2010 | Baraniuk | H03L 7/07 |
| | | | 702/66 |
| 2012/0250748 A1* | 10/2012 | Nguyen | G01S 13/0209 |
| | | | 375/224 |

* cited by examiner

*Primary Examiner* — David S Huang
(74) *Attorney, Agent, or Firm* — Oblon, McClelland, Maier & Neustadt, L.L.P.

(57) ABSTRACT

A compressed sensing method based on non-uniform wavelet bandpass sampling. A K-sparse signal of interest is projected onto a sequence of waveforms succeeding one another at the bandpass sampling rate, the waveforms belonging to an overcomplete dictionary, the parameters of the waveforms depending on the characteristics of the bands of the signal. The correlation values are then non-uniformly sampled to provide a compressed representation of the signal.

16 Claims, 10 Drawing Sheets

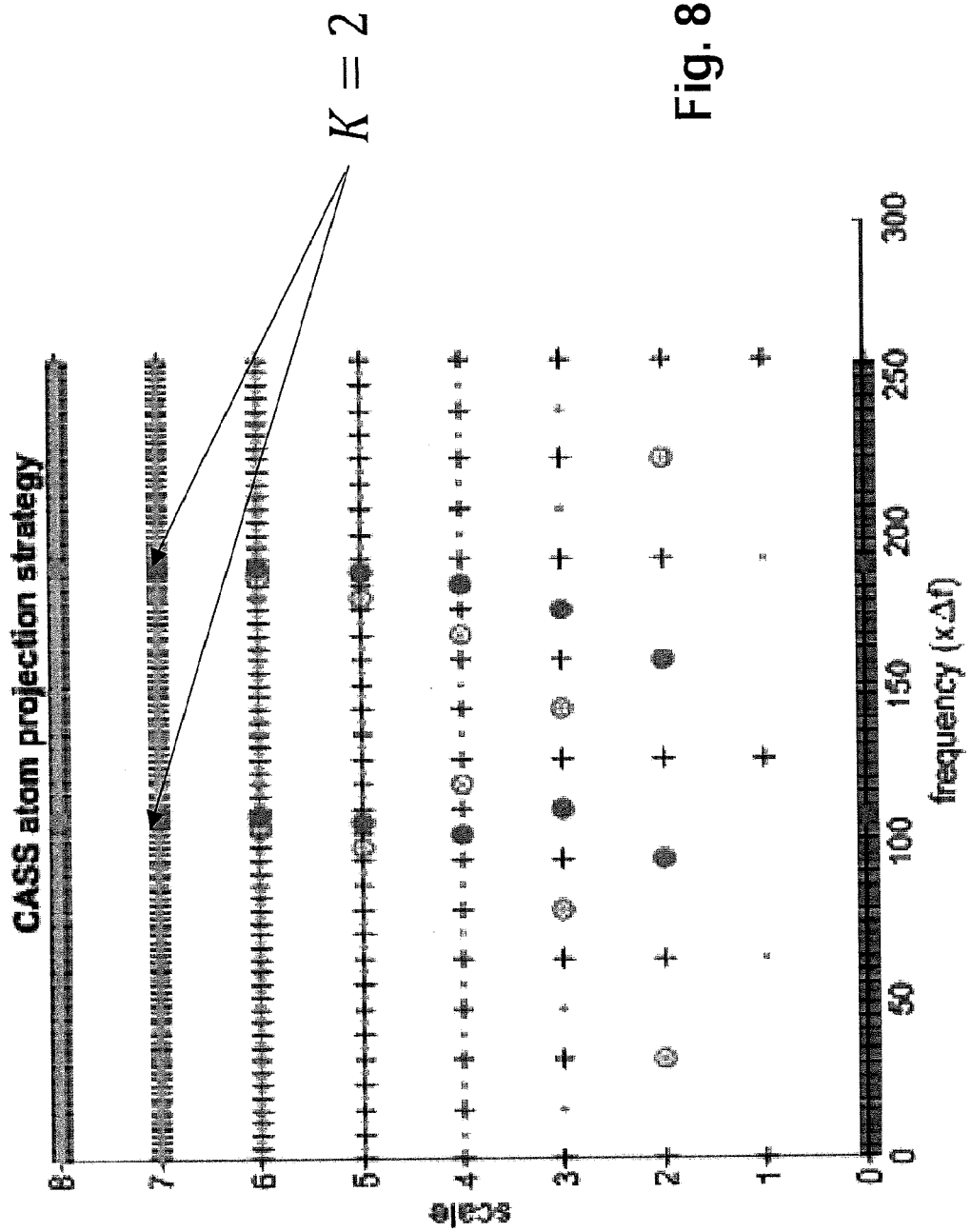

METHOD OF NON-UNIFORM WAVELET BANDPASS SAMPLING

FIELD OF THE INVENTION

The present invention relates to the field of compressed sensing and more specifically to compressed sensing by using a wavelet dictionary.

BACKGROUND OF THE INVENTION

Compressed sensing, also known as compressive sensing or compressed sampling or sparse sampling is a rapid growing field that has attracted considerable attention in recent years.

The ever increasing amount of data generated by sensing systems such as wireless sensor networks (WSNs) has dramatically emphasized the need for sampling measurement signals at a low rate, i.e. below the Nyquist frequency. Compressive sensing theory states that a signal can be sampled without information loss at a rate close to its information content (Landau rate).

In general, sampling a signal x below the Nyquist frequency, that is at a frequency lower than $f_{Nyq}=2f_{max}$, where $f_{max}$ is the highest frequency present in the spectrum, leads to aliasing and therefore impedes signal recovery. Assuming that the signal is sampled at the Nyquist frequency $f_{Nyq}$ in a given interval of a real (e.g. of time or space), it can be represented by a vector denoted x of size N in the canonical basis (instants in time, points in space) of this domain.

However, if the representation of x is K-sparse in a given domain (hereinafter called sparse domain), i.e. has at most K nonzero values in a basis spanning this domain, it can be recovered from a number M of linear measurements which is in the order of magnitude of K log N. If we denote y the measurement vector that is the vector constituted of these M linear measurements, it can be expressed as:

$$y=\Phi x=\Phi\Psi s \qquad (1)$$

where s is the K-sparse representation of x in the sparse domain, Y is the transformation matrix (also called sparsity matrix) of size N×N from the basis spanning the dual domain to the canonical basis, and $\Phi$ is the measurement matrix (also called acquisition matrix) of size M×N, with typically M<<N, capturing the reduction of dimensionality.

The signal s can then be recovered from the measurement vector y, the signal estimate $\hat{s}$ being obtained minimizing the L1-norm:

$$\hat{s} = \underset{z \in B(y)}{\operatorname{argmin}} \|z\|_{l_1} \text{ where } B(y) = \{z \,|\, \|\Phi\Psi z - y\|_{l_2} \le \varepsilon\} \qquad (2)$$

where, $l_1$ and $l_2$ denote respectively the L1-norm and the L2-norm, B(y) ensures that $\hat{s}$ is consistent with the measurement vector y and $\varepsilon$ is a tolerance parameter dependent upon the noise.

Several reconstruction algorithms have been proposed in the literature, e.g. the basic pursuit algorithm (BP), the orthogonal matching pursuit algorithm (OMP) and the tree-based OMP (TOMP).

A comprehensive introduction to compressive sensing can be found in Chap. I of the book entitled "Compressive sensing: theory and its applications" by Y. C. Eldar and G. Kutyniok, Cambridge University Press, 2012.

A first example of compressive sensing method is non-uniform sampling (NUS).

We assume in the following that the signal to be sampled is K-sparse in the frequency domain.

Non-uniform sampling allows a sample rate close to the optimal information rate (i.e. the Landau rate) to be approached without complicated analog processing. In a nutshell, a NUS sampler samples the input signal at irregularly distributed instants by taking only a subset of the samples of a Nyquist converter. Assuming an acquisition window of length $T_{acq}$, the number of samples acquired by the NUS is equal to $M<N=f_{Nyq}T_{acq}$, where M samples are chosen at random among the N samples of the Nyquist converter.

As shown on FIG. 1, a NUS sampler can be implemented by a sample-and-hold stage followed by an ADC operating at a sampling rate corresponding to the shortest sampling period used by the NUS.

Using the formalism of expression (1) the non-uniform sampling can be expressed as:

$$y=R_T I_N F^{-1} s \qquad (3)$$

where the transformation matrix is here $\Psi=F^{-1}$, i.e. the inverse discrete Fourier transform (DFT), $I_N$ is the matrix identity of size N×N, with $N=f_{Nyq}T_{acq}$, and $R_T$ is a selection matrix of size M×N representing a random selection of M columns among N of the identity matrix. Each row of $R_T$ has an element equal to 1 and all other elements equal to 0, the M column indicia of the elements equaling to 1 being chosen at random among $\{1, \ldots, N\}$. The measurement matrix is therefore simply $\Phi=R_T I_N$.

The non-uniform sampling method is a simple compressive method but has several shortcomings.

First, in case the signal input to the NUS sampler is wideband, the ADC still needs to capture a snapshot of this wideband signal with frequencies possibly reaching up to the highest frequency present in the spectrum.

Second, although the NUS sampler operates at a sub-Nyquist rate, a clock at the Nyquist rate is required to synchronize the samples.

Third, a NUS sampler is highly sensitive to timing jitter. If the input signal varies rapidly, a small error in the sampling time may lead to an erroneous sample value.

A second example of compressive sensing method is random-modulation pre-integration (RMPI). According to this scheme, the signal is mixed in parallel channels with a plurality of pseudo-random binary sequences (PRBS) at the Nyquist rate, the output results being integrated and sampled at a low rate. The idea behind RMPI is that it is much easier to mix a wideband signal at the Nyquist rate than to accurately sample it at this rate.

More recently, it has been proposed in patent U.S. Pat. No. 8,836,557 to achieve compressed sensing of a signal by exploiting its sparsity in a Gabor frame representation. More specifically, the signal is mixed in a plurality of channels operating in parallel with modulating waveforms belonging to a Gabor frame and the modulation products are integrated over a finite time interval. The modulating waveforms are designed such that the mixing operation produces weighted superposition of various subs-sections of the signal related to different sub-intervals of the finite time interval. The integration results provide sample values that represent the signal and enable its reconstruction.

However, this method is not optimal for a multiband signal inasmuch as it does not exploit the structure of the signal spectrum. In addition, the pseudo-random binary sequence needs to be run at a high rate and therefore leads to a high power consumption.

The purpose of the present invention is therefore to propose a compressed sensing method which does not present the disadvantages of the prior art, in particular which enables sampling of a sparse multi-band signal at a very low rate, close to the information rate.

BRIEF DESCRIPTION OF THE INVENTION

The present invention is defined in the appended independent claims. Various preferred embodiments are defined in the dependent claims.

BRIEF DESCRIPTION OF THE DRAWINGS

The present invention will be better understood from the description of the following embodiments, by way of illustration and in no way limitative thereto:

FIG. 8 illustrates an example of spectral support recovery.

DETAILED DISCLOSURE OF PARTICULAR EMBODIMENTS

We will assume in the following that the signal of interest x is sparse in the frequency domain, i.e. that only few (K) coefficients of the vector s=Fx, where F is a Fourier matrix, are non-zero. By non-zero it is meant here that these coefficients are greater in absolute value than a predetermined threshold $\eta$. In addition it is assumed that the signal may occupy a plurality $N_T$ of bands known a priori. The K non-zero coefficients are clustered within a subset of $N_b < N_T$ bands of these bands ($N_b \geq 1$), hereinafter referred to as bands of interest. Hence, the frequency support $\Omega$ of the signal may be expressed in terms of bands of interest:

$$\Omega = \bigcup_{i=1}^{N_b} B_i \quad (4)$$

where $B_i$, i=1, ..., $N_b$ denote the bands where there is at least one spectral coefficient exceeding $\eta$.

Finally, it will be assumed that the respective central frequencies $f_i^c$ of the bands of interest $B_i$ are known or can be determined. A method for determining the boundaries of the bands is described further below.

Figure 1:
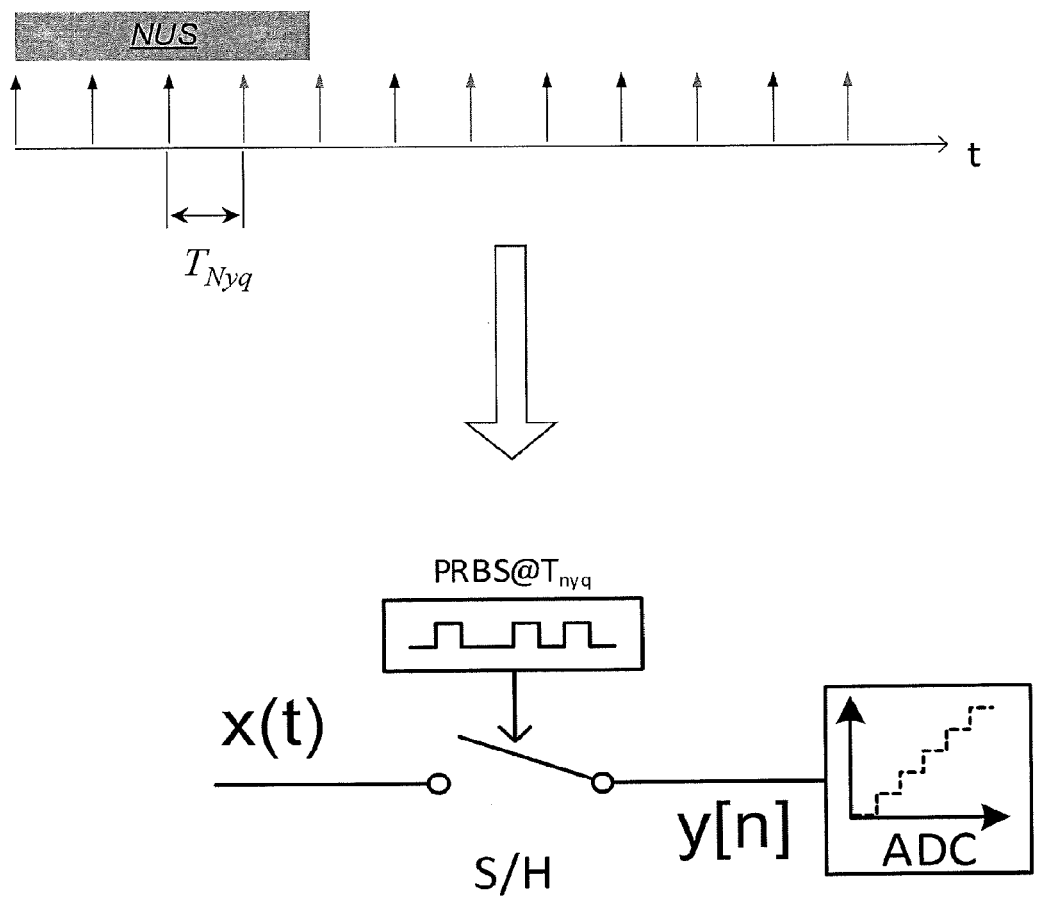
FIG. 1 schematically illustrates a non-uniform sampling method known from the prior art.
Figure 2:
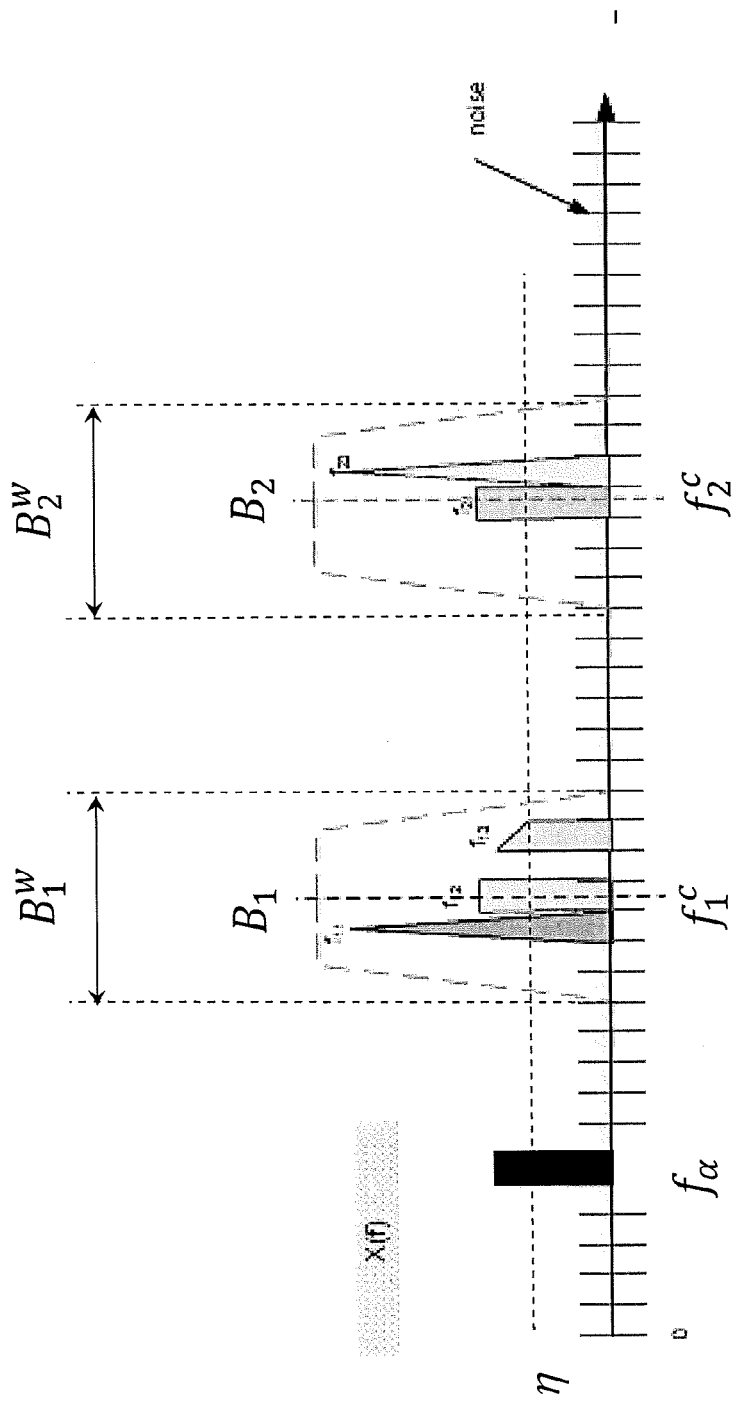
FIG. 2 represents the spectrum of a sparse signal which can be sampled by the compressed sensing method of the invention.

FIG. 2 represents the spectrum of a sparse signal x which can be sampled by the compressed sensing method of the invention.

In the present instance, the spectrum of the sparse signal lies within two bands of interest $B_1, B_2$ respectively centered around the frequencies $f_1^c, f_2^c$. The non-zero component at the frequency $f_\alpha$ lies outside the bands of interest and is considered as an interference signal.

From bandpass sampling theory (see for example the article of R. G. Vaughan et al. entitled "The theory of bandpass sampling published in IEEE Trans. on Signal Proc., Vol. 39, No. 9, September 1991, pp. 1973-1978", it is known that if a signal exhibits a band of bandwidth $B^w$ located between a frequency $f_L$ and a frequency $f_H$, the signal can be sampled at the frequency $2B^w$ without suffering aliasing coming from within the band $B^w$ itself. In other words, the samples at the Nyquist rate can be decimated by an undersampling factor $$\gamma = \frac{f_{Nyq}}{B^w}.$$

Bandpass sampling theory has been generalized to accommodate the sampling of multi-band signals as described in the article of R. Venkataramani et al. entitled "Optimal sub-Nyquist non-uniform sampling and reconstruction for multi-band signals" published in IEEE Trans. on signal processing, Vol. 49, No. 10, October 2001, pp. 2301-2313. Basically, a multiband signal can be sampled by taking samples on a periodic non-uniform time grid where the basic frequency of the sampling grid is chosen as the lowest sampling rate $f_s$ guaranteeing the absence of aliasing (that is the overlap of copies of the spectrum, translated by multiples of $\Omega$, $\lambda(\Omega) \leq f_s \leq \lambda([\Omega])$, where $[\Omega]$ is the smallest interval containing $\Omega$ and $\lambda(.)$ denotes the Lebesgue measure. This method of non-uniform sampling is also called multi-coset sampling in the literature.

However, bandpass sampling and multi-coset sampling dramatically suffer from aliasing, coming from outside $\Omega$, and therefore turn out to be less efficient than conventional Nyquist sampling. The signal to noise ratio (SNR) is indeed degraded by the sub-sampling ratio. If the signal of interest is affected by interference located outside the support $\Omega$, the interference lines are folded into the baseband, thus preventing an accurate reconstruction thereof The idea underlying the invention is first to perform a projection of the signal of interest onto waveforms belonging to a Gabor frame or wavelet frame, the waveforms succeeding one another at the lower bound bandpass sampling rate $f_\Omega = \lambda(\Omega)$, the parameters of the waveforms being chosen according to the characteristics of the bands $B_i$, i=1, ..., $N_b$, and then to non-uniformly sample the projection results thus obtained. The compressed sensing method according to the invention can therefore be regarded as a non-uniform wavelet bandpass sampling method (Wav-NUBPS).

First, it is recalled that a wavelet is a waveform of limited duration, zero average and non-zero norm. A continuous function x(t) in $L^2(\mathbb{R})$ (and more generally $L^2(\mathbb{C})$) can be represented by a set of functions $\psi_{s,\delta}(t)$ obtained by scaling (with scale s) and shifting (with shift $\delta$) a mother wavelet $\psi$.

The wavelet transform of a continuous function $x(t) \in L^2(\mathbb{R})$ is defined by:

$$Wx_{s,\delta} = \langle x, \psi_{s,\delta}\rangle = \int_{-\infty}^{+\infty} x(t)\psi_{s,\delta}^*(t)dt = \int_{-\infty}^{+\infty} \frac{1}{\sqrt{s}} x(t)\psi^*\left(\frac{t-\delta}{s}\right)dt \quad (5)$$

where $$\psi_{s,\delta} = \frac{1}{\sqrt{s}}\psi\left(\frac{t-\delta}{s}\right)$$

is a scaled and shifted version of the mother wavelet $\psi$.

By projecting $x(t)$ onto the wavelet at various continuous scales and positions, a function of two variables $Wx(s,\delta)$ is defined, called the continuous wavelet transform (CWT) of x. Thus, the CWT represents a one dimensional signal in a two-dimensional time-frequency domain $(s,\delta)$. In practice, the continuous variables $s$ and $\delta$ are replaced by their discrete counterparts $s_j = s_0^j$ and $\delta_{k,j} = k\delta_0 s_0^j$, $k, j \in \mathbb{Z}$, the time-frequency domain being covered by waveforms belonging to a frame (or dictionary):

$$D_\psi = \left\{\frac{1}{s_0^{j/2}}\psi\left(\frac{t-k\delta_0 s_0^j}{s_0^j}\right)\right\}_{j\in\mathbb{Z}, k\in\mathbb{Z}} \quad (6)$$

$D_\psi$ is in general an overcomplete frame and not necessarily a basis of $L^2(\mathbb{R})$. The projection of $x(t)$ onto the waveforms of the dictionary defines a set of discrete values, $Wx(s_j,\delta_{k,j})$ called the discrete wavelet transform (DWT) of x.

Similarly, the signal of interest can be projected onto a Gabor frame constituted by the waveforms:

$$g_{k,j}(t) = g(t-ak)e^{2\pi i b j t} \quad (7)$$

where $g(t)$ is a window function (e.g. a raised cosine window) having a non-zero value only over a window width and a zero value elsewhere, a is a discretization interval in time and b is a discretization interval in frequency, and $k \in \mathbb{Z}$, $j \in \mathbb{Z}$. Hence, $g_{k,j}(t)$ is a waveform centered around the instant $a \cdot k$ and the frequency $bj$.

The time-frequency domain is covered by the overcomplete frame (Gabor frame):

$$D_G = \{g_{k,j}(t)\}_{k\in\mathbb{Z}, j\in\mathbb{Z}} \quad (8)$$

It will be understood that, contrary to the Morlet frame, the waveforms of the Gabor frame all have the same time window width described by the time support of the window function $g(t)$.

Similarly as explained above, the signal of interest $x(t)$ can be projected onto the waveforms of the frame, thereby defining a set of discrete values:

$$Gx(k \cdot a, j \cdot b) = \langle x, g_{k,j}\rangle = \int_{-\infty}^{+\infty} x(t)g(t-ak)e^{-2\pi i b j t}dt \quad (9)$$

where $\langle \ \rangle$ denotes the Hermitian dot product.

The signal of interest $x(t)$ being K-sparse in the frequency domain, it can be represented by a vector s having K non-null elements in the Fourier basis, where $x=\Psi s$.

The signal $x(t)$ can be measured by projecting it on a set of waveforms of the dictionary (Gabor frame, Morlet frame or wavelet Haar basis).

The measurement column vector, y, thus obtained can be expressed as in (1) where the sparsifying or transformation matrix $\Psi = F^{-1}$ is the inverse discrete Fourier transform and the measurement matrix is $\Phi = R_T W^T$, $R_T$ being the selection matrix (selection of M rows of the sampling matrix $W^T$, hence of M columns of the matrix W) and W is a matrix of size N×N, representing the $N_s$ atoms of the dictionary in the N dimension space. More specifically, each of the $N_s$ rows of the sampling matrix $W^T$ represents an atom defined by one or more parameters. For example, each row of $W^T$ is defined by the parameter pair $(s,\delta)$ in case of Morlet wavelets and the parameter pair $(a,b)$ for a Gabor frame.

In other words, the index of the row in the matrix W corresponds to the time index while the index of the column corresponds to a waveform index in the dictionary defined by a given set of parameters.

If the dictionary is a wavelet frame, the elements of the matrix W are given by:

$$W_{k,j} = \psi_{k,j}[t] = \frac{1}{s_0^j}\psi\left(\frac{t-k\delta_0 s_0^j}{s_0^j}\right) \quad (10)$$

where $s_0^j$ is the scale of the waveform $k\delta_0 s_0^j$ is the time-shift of the waveform with respect to the origin of the time axis.

If the dictionary is a Gabor frame, the elements of the matrix W are given by:

$$W_{k,j} = g(t-ka)e^{2\pi i b j t} \quad (11)$$

Therefore the waveform index corresponds here to a couple of scale and time delay in the case of a wavelet frame and a couple of carrier frequency and time delay in the case of a Gabor frame.

Figure 3:
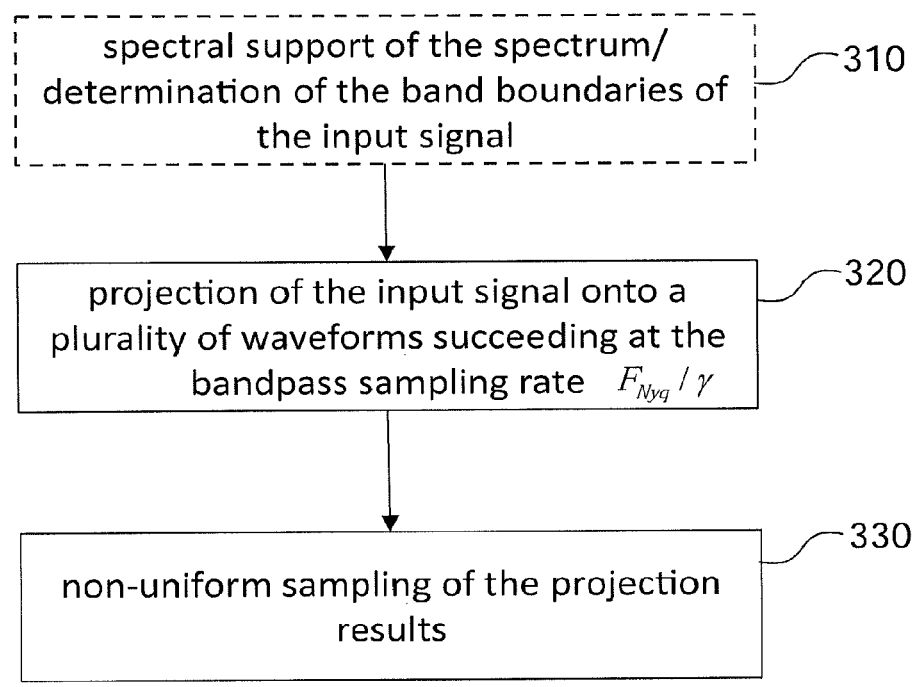
FIG. 3 schematically illustrates a flow chart of the compressed sensing method according to the invention.

FIG. 3 schematically illustrates a flow chart of the compressed sensing method according to the invention.

The compressed sensing method assumes prior knowledge of the band boundaries of the multi-band sparse signal of interest $x(t)$. If these band boundaries are not known, a support recovery of the spectrum is carried out at step 310 and the bands of interest are derived therefrom. In this sense, step 310 is optional as shown by the dashed line. Various algorithms can be used for this recovery such as the compressive binary search (CBS) method described in the article of M. A. Davenport et al. entitled "Compressive binary search" published in the Proc. of IEEE International Symposium on Information Theory (ISIT), February 2012, included herein by reference. A refined CBS method using wavelets that demonstrates a practical implementation solution will be explained further below in relation with FIG. 7.

At step 320, the signal of interest is projected onto, i.e. correlated with, a plurality of waveforms belonging to a dictionary, typically an overcomplete dictionary (Gabor frame, wavelet frame e.g. C-Morlet wavelet frame) or a simple basis (Haar wavelet family). These waveforms succeed one another at the sampling rate $$f_\Omega = \frac{f_{Nyq}}{\gamma}, \gamma = \frac{f_{Nyq}}{f_\Omega}$$

being defined as the undersampling factor. Two consecutive waveforms are therefore separated by $T_\Omega = \gamma T^{Nyq}$.

More specifically, if the signal of interest is a multiband signal exhibiting $N_b$ bands of respective bandwidths $B_i^w$, $i=1, \ldots, N_b$, the undersampling factor is given by:

$$\psi = \frac{f_{Nyq}}{\sum_{i=1}^{N_b} B_i^w} = \frac{f_{Nyq}}{B_{agg}^w} \qquad (12)$$

where $$B_{aqq}^w = \lambda(\Omega) = \sum_{i=1}^{N_b} B_i^w$$

is the aggregated bandwidth of the multiband signal.

Although the number of sampling instants is reduced by the undersampling factor $\gamma$ with respect to conventional sampling at the Nyquist frequency, it should be understood that the number of points of the sampling grid (corresponding to the number of available atoms) can be much higher than the original dimension space N (corresponding to the number of samples at the standard Nyquist rate $N=T_{acq}/T_{Nyq}$) when an overcomplete dictionary is used In case of a Gabor frame, the waveforms are indexed by their central frequencies bj and their time shifts ak, where the time shifts are defined from the beginning of the acquisition window. Hence, the Gabor frame provides a sampling grid of $N \times N_{fc}$ points, the granularity on time axis being $T_{Nyq}$ and $$N_{fc} = \frac{\sum_{i=1}^{N_b} B_i^w}{b}$$

being the number of central frequencies used. However, the fact we perform bandpass sampling at $f_\Omega$ amounts to a selection of $N_\Omega \times N_{fc}$ points in the sampling grid where $N_\Omega = f_\Omega T_{acq}$. In other words, the sampling grid actually used for the present invention exhibits a coarser time granularity than at the Nyquist frequency.

Similarly, in case of a wavelet frame (e.g. C-Morlet frame), the waveforms are indexed by their scales $s_0^j$ and their time shifts $k\delta_0 s_0^j$. Hence, the wavelet frame provides a non-uniform sampling grid of $N_{sc} \times N_\delta$ points where $N_{sc}$ is the number of scales and $N_\delta$ the number of elementary shifts available in the dictionary for a given scale. As it can be seen from expression (10) the time shifts depend on the considered scale. A low scale value is associated with short duration wavelets and therefore with short time shifts whereas a high scale value is associated with long duration wavelets and therefore with long time shifts. At any rate, the time shift resolution shows a coarser time granularity than at the Nyquist frequency.

In view of the non-uniform sampling step 330 described further below, it is generally sufficient to project the signal onto only one waveform per bandpass time shift. However, if more diversity is required, the signal can be projected on a plurality of waveforms per time shift, for example different scales (wavelet frame) and/or different central frequencies (Gabor frame).

Additionally, the parameters of the waveforms used for the projection are chosen based on the characteristics of the bands $B_i$ of the input signal. In other words, only a subset of the dictionary may actually be used for the projection.

For example, in case of a Gabor frame, the time width of the window function g(t) is chosen to be shorter than the inverse of the aggregated bandwidth, $B_{agg}^w$, so that each projection captures information over the whole bandwidth of interest. In other words, the spectrum of the window function should be as flat as possible over the bandwidth of interest and not concentrate energy on a specific frequency within the support. Alternatively, a specific window $g_i(I)$ can be chosen for each individual sub-band $B_i$, the time width of the window function $g_i(t)$ being shorter that the bandwidth $B_i^w$ of the bandwidth it is associated with.

Similarly, in case of a wavelet frame, the scale s can be chosen higher than a predetermined value depending upon $B_{agg}^w$ in order to capture information of the signal over the whole bandwidth of interest. The benefit of this approach would be to extract information with variable frequency resolution according to the scale.

More generally, the waveforms used for the projection are selected from the dictionary, such that the mutual coherence of the matrix $W^T$ and the matrix $F_\Omega^{-1}$ where $W^T$ is the sampling matrix (or projection matrix) and $F_\Omega^{-1}$ is the matrix of the inverse Fourier transform limited to the spectral support $\Omega$. The mutual coherence of $W^T$ and $F_\Omega^{-1}$ is defined as:

$$\mu(W^T, F_\Omega^{-1}) = \sqrt{N} \sup_{i,j} |A_{i,j}| \text{ where } A = W^T F_\Omega^{-1} \qquad (13)$$

Hence, the lower the mutual coherence of $W^T$ and $F_\Omega^{-1}$, that is the lesser the mutual coherence between the sampling matrix and the sparsifying matrix, the better the spreading of the measurement over the spectral support $\Omega$.

It has been shown that, in order to minimize the mutual coherence and to optimally spread out the measurements over the spectral support, the ratio between the waveform bandwidth and the aggregated signal bandwidth, that is the relative bandwidth of the waveform, should be higher than 50%.

Furthermore, the waveforms are advantageously chosen so that their central frequencies lie within the spectral support.

Figure 4B:
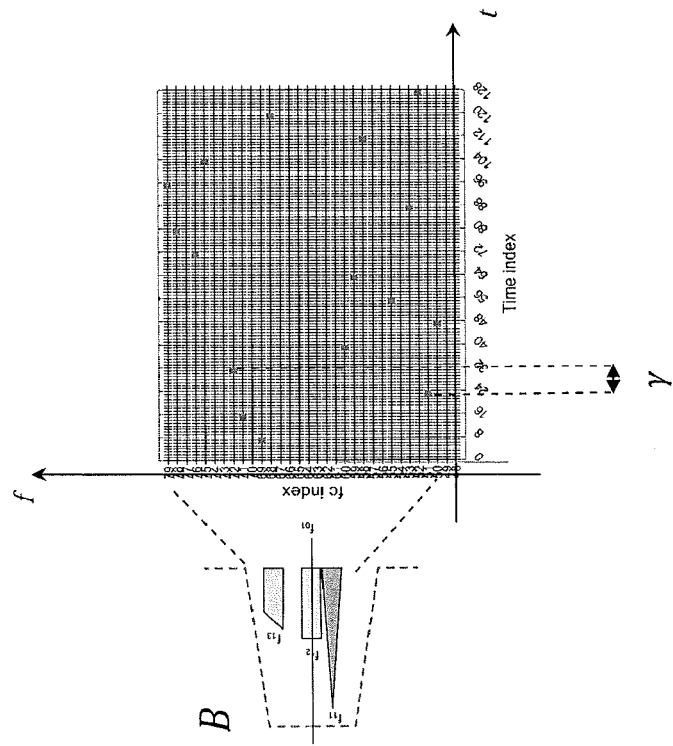
FIG. 4B illustrates a second example of a sampling grid used in the compressed sensing method of FIG. 3.
Figure 4A:
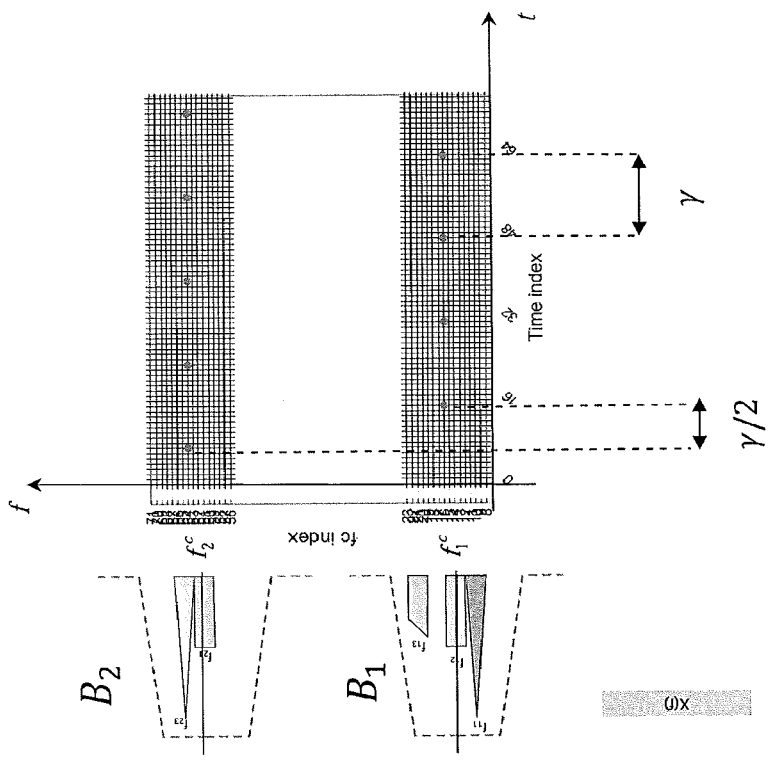
FIG. 4A illustrates a first example of a sampling grid used in the compressed sensing method of FIG. 3.

FIG. 4A illustrates an example of a sampling grid used for sampling a signal having two bands $B_1$ and $B_2$ of equal bandwidth $B^w$, respectively centered around the frequencies $f_1^c, f_2^c$. The dictionary used here is a Gabor frame. The horizontal index of the sampling grid is given by the time shift (from the beginning of the acquisition window) and the vertical index is the central frequency of the waveform.

The selected atoms are distributed in time every $T_\Omega = \gamma T_{Nyq}$. They comprise a first plurality of waveforms following one another every $$\frac{\gamma}{2} T_{Nyq}$$

and a second plurality of waveforms following each other every $$\frac{\gamma}{2} T_{Nyq},$$

the waveforms of the first plurality alternating with the waveforms of the second plurality. The central frequencies (bj) of the waveforms of the first plurality are distributed within the band $B_1$ and the central frequencies of the waveforms of the second plurality are distributed within the band $B_2$.

More generally, the waveforms used for the projection of a multiband signal form a sequence recurring with a period $\gamma T_{Nyq}$, the waveforms being distributed among a plurality of sets, each set being associated with a given band of the multiband signal, the waveforms belonging to different sets being interleaved. The waveforms associated with a band $B_i$ form a subsequence of the sequence and recur with a period $$\frac{B_{agg}^w}{B_i^w} \gamma T_{Nyq},$$

the union of these subsequences providing the sequence in question.

FIG. 4B illustrates a second example of a sampling grid used for sampling a signal having one band of bandwidth $B^w$. Here the central frequencies of the waveform are randomly distributed within the band $B^w$, the waveforms used for the projection recurring at the period $\gamma T_{Nyq}$. The use of random distributed central frequencies ensures that the folding of an interfering spectral line is spread within the baseband instead of being folded on the same baseband frequency.

Turning back to FIG. 3, the correlation results obtained by the projection step 320 are then non-uniformly sampled at step 330. This step is represented by the selection matrix $R_T$. As already stated above, the selection matrix performs a selection of the correlation results, that is a selection of the columns of W (hence a selection of the rows of the sampling matrix $W^T$). The non-uniform sampling means that the correlation results are not decimated at a fixed rate. Only M correlations results are selected at random out of $N_\Omega = N/\gamma$ (according to a uniform probability distribution) are upheld and the other results are discarded (or even not computed for the sake of power consumption reduction as explained in the preferred variant set out further below).

If the acquisition interval of the signal is $T_{acq}$, the M sampling instants (equivalent to time shifts) are randomly selected among $N_\Omega$ sampling instants uniformly distributed over the acquisition interval, where $N_\Omega = T_{acq} \cdot f_{Nyq}/\gamma$.

The expression sampling matrix should not be misconstrued: it provides here the correlation results with waveforms of the dictionary instead of Dirac pulses sampling as in the conventional sampling approach (the correlation with Dirac pulses results sampling the signal of interest at the instants of the pulses). By doing so, the invention mitigates drastically the level of aliasing. Indeed, the correlation of the signal of interest x(t) with the waveform ψ(t) is equivalent, in the frequency domain, to a multiplication of the spectrum s(f) of this signal with the conjugate of the Fourier transform of the waveform, denoted Ψ°(−f). Therefore, each measurement produces a filtered version of s(f) instead of the whole spectrum.

For example, in case the dictionary is a Gabor frame, the Gabor atoms exhibit a Gaussian shape in the frequency domain which is very efficient for rejection purposes. As a result the method according to the invention outperforms the bandpass sampling approach in terms of noise and interference out of band rejection efficiency. In addition, it allows for a compression down to the information rate reducing the data stream. Finally, the solution does not require any high speed A/D converter operating at the Nyquist rate.

Figure 5A:
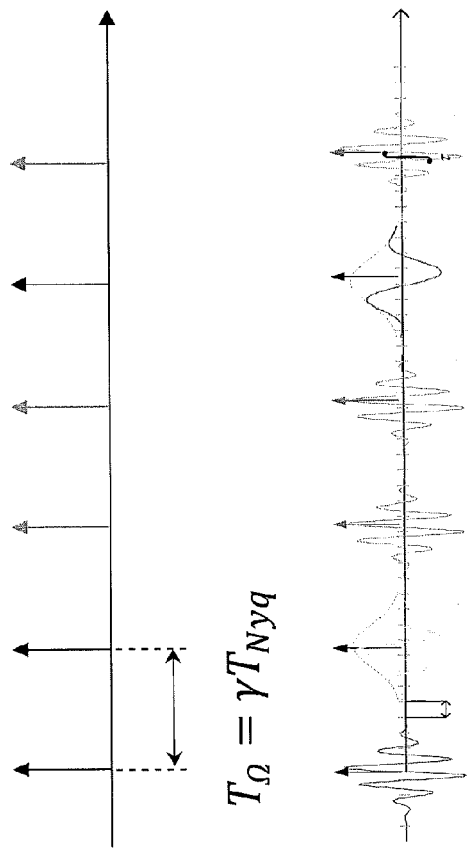
FIG. 5A schematically represents a first example of implementation of the compressed sensing method of FIG. 3.
Figure 5A:
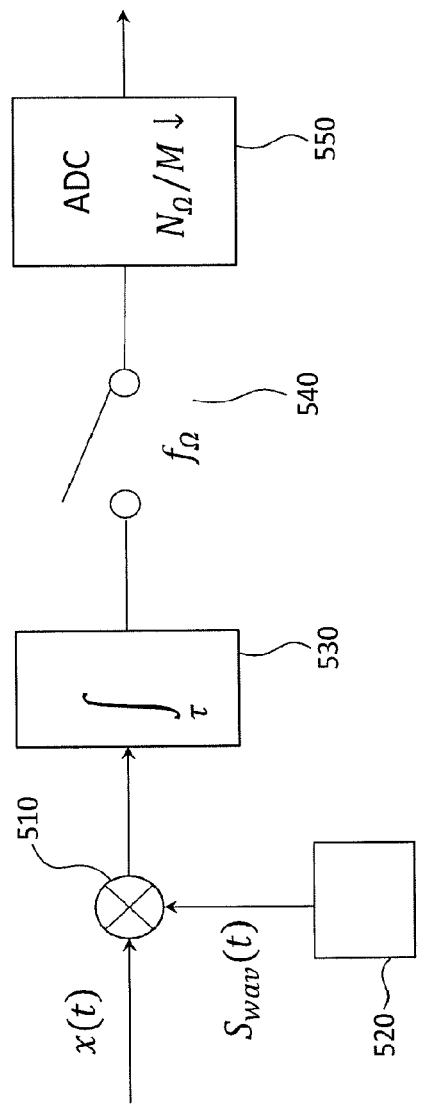

FIG. 5A schematically represents a first example of implementation of the compressed sensing method of FIG. 3.

The input K-sparse multiband signal x(t) is mixed in an analog mixer 510 with a sequence $S_{wav}(t)$ of waveforms following each other at the bandpass sampling interval $T_\Omega = \gamma T_{Nyq}$, where γ is the undersampling factor defined in (12). In other words, the sequence $S_{wav}(t)$ is constituted of waveforms time shifted at multiples of the bandpass sampling interval $T_\Omega = \gamma T_{Nyq}$.

The waveforms are generated by a waveform generator 520 that will be described in more detail further below.

The waveforms belong to an overcomplete dictionary such as a wavelet frame or a Gabor frame. Alternately, the Haar basis can also considered.

The output of the mixer 510 is integrated over intervals of length τ. The integration time r is advantageously chosen equal to the maximum time width of the waveforms in order to prevent noise integration. The integrator 530 operates at the rate $1/T_\Omega$ so that a correlation value (or projection value) is provided at each and every period $T_\Omega$.

The sequence of correlation values is then non-uniformly sampled at random in the ADC converter 540, with an average decimation rate of $N_\Omega/M$. In other words, M correlation values are selected randomly out of $N_\Omega$ and digitally converted. The correlation values are output at the rate $$\frac{M}{T_{acq}}$$

which can be made arbitrarily close to the Landau rate.

According to a preferred variant, the waveform generator does not output a waveform (in other words its output is inhibited) when the correlation value is not sampled by the A/D converter. The sequence of waveforms where M out of $N_\Omega$ are randomly upheld and the others are omitted is denoted $S_{wav}^{rdm}(t)$. The omitted waveforms are shown in grey in the original sequence $S_{wav}$. In that instance the output of a pseudo-random binary sequence (PRBS) generator (not shown), in practice a linear feedback shift register (LFSR), controls both the output of the waveform generator 520 and the A/D converter 550.

Figure 5B:
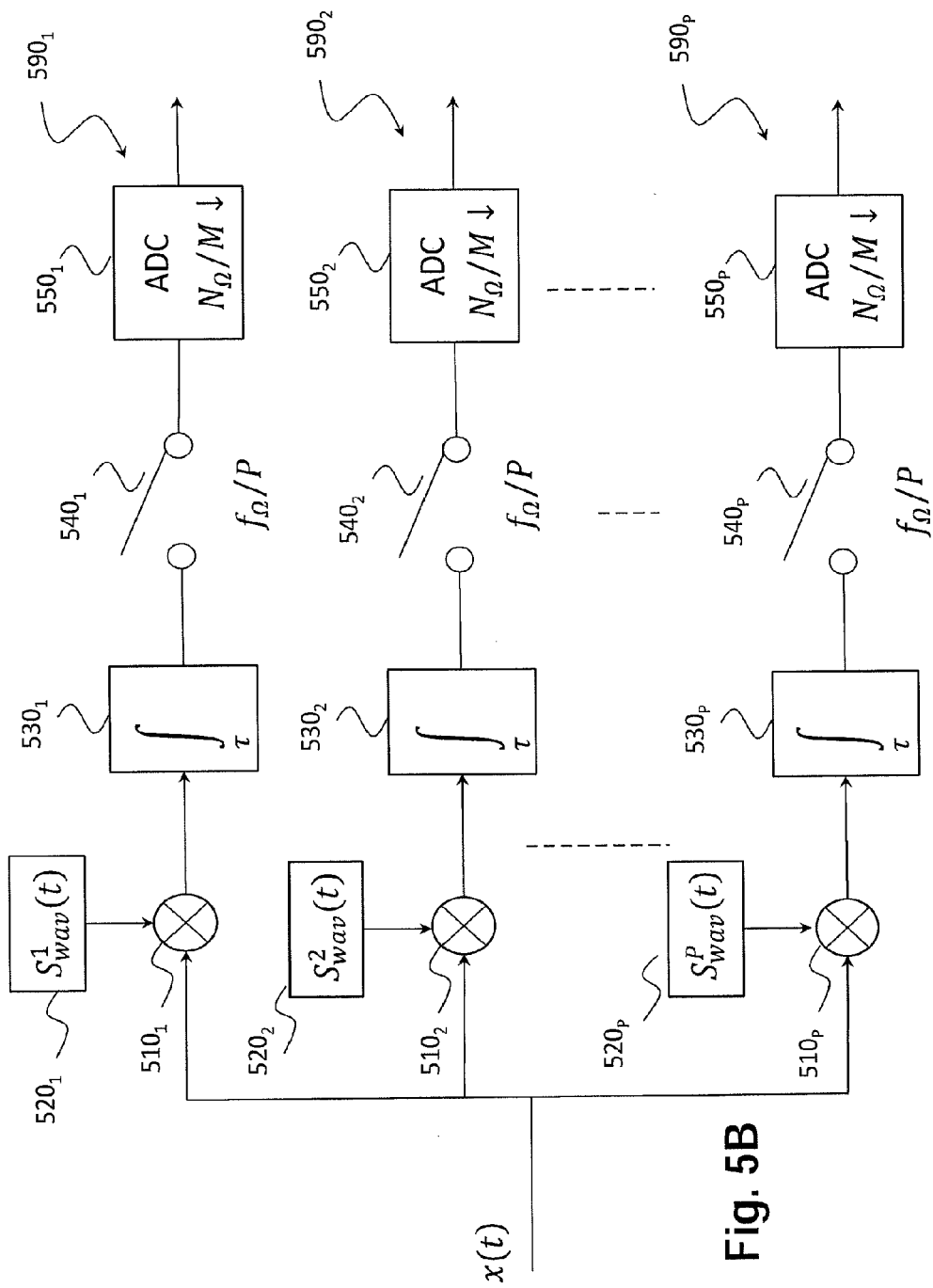
FIG. 5B schematically represents a second example of implementation of the compressed sensing method of FIG. 3.

FIG. 5B schematically represents a second example of implementation of the compressed sensing method of FIG. 3.

This second example of implementation differs from the first one in that it comprises a plurality P of projection and non-uniform sampling branches operating in parallel.

More specifically, each branch $590_p$, p=1, . . . , P comprises an analog mixer $510_p$ mixing the input signal with a subsequence of waveforms $S_{wav}^p$ obtained by decimating the sequence $S_{wav}$ by a factor P. More specifically, if we denote $S_{wav}(1)$, $S_{wav}(2)$, $S_{wav}(3)$ . . . the waveforms of the sequence $S_{wav}$ at $T_\Omega$, $2T_\Omega$, $3T_\Omega$, . . . the mixer $510_p$ mixes the input signal with the sequence S, comprised of the waveforms $S_{wav}(p)$, $S_{wav}(p+P-1)$, $S_{wav}(p+2P-1)$, . . . generated by a corresponding waveform generator $520_p$. The integrator $530_p$ integrates the mixer output over intervals of length τ. In contrast to the previous example, the integrator $530_p$ operates at the reduced rate $1/(PT_\Omega)$. The subsequence of correlation values is non-uniformly sampled by the A/D converter $540_p$, with an average rate of $N_\Omega/M$, each A/D converter being driven by a corresponding PRBS generator (not shown). The compressed sensing measurements are represented by the set of sampled correlation values provided by the P branches. The correlation values are output at the rate $$\frac{M}{T_{acq}}$$

which can be made arbitrarily close to the Landau rate.

The preferred variant mentioned in relation to FIG. 5A can also be applied here by providing a serial-to-parallel (S/P) converter (not shown) at the output of the PRBS generator for outputting words of P bits at the reduced rate $1/(PT_\Omega)$, the $i^{th}$ bit output by the S/P converter controlling the waveform generator $520_p$ together with the A/D converter $550_i$.

Finally, it should be noted that the sampling rates and the decimation rates of the various branches need not be equal. For example the $i^{th}$ branch, i=1, . . . , P, may use a sampling rate of $f_s^i=f_\Omega/p_i$ and a decimation rate $N_\Omega/m_i$, where $$\sum_{i=1}^{P} \frac{m_i}{p_i} = M.$$

In such instance, it can be shown that the number of samples retained over the acquisition time $T_{acq}=N_\Omega T_\Omega$ remains equal to M. Preferably, these values $p_i$ are chosen such that $p_i=2^{i-1}$.

Figure 5C:
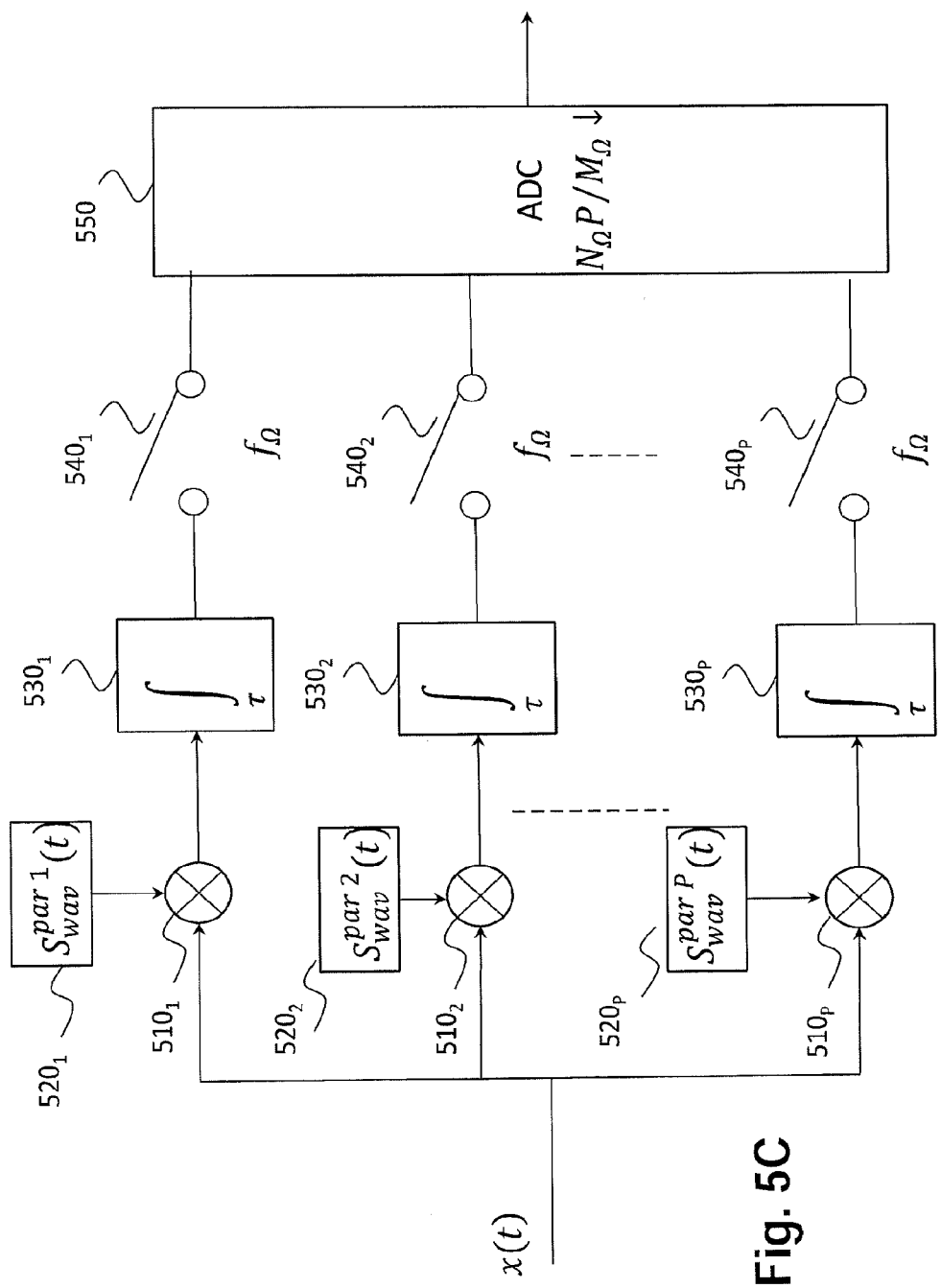
FIG. 5C schematically represents a third example of implementation of the compressed sensing method of FIG. 3.

FIG. 5C schematically represents a third example of implementation of the compressed sensing method of FIG. 3.

This third example of implementation differs from the second one in that each branch is dedicated to a given waveform parameter or a given set of waveform parameters. The sequence of waveforms generated by a waveform generator $520_p$ is denoted $S_{wav}^{par\ p}$. For example, each branch can be dedicated to a given scale (in case of use of a wavelet frame) or a given central frequency of the waveform (in case of use of a Gabor frame).

The various branches do not necessarily operate at the reduced rate $1/(PT_\Omega)$ but may operate a higher rate up to $1/T_\Omega$. If we assume that the P branches operate synchronously at the bandpass sampling rate $1/T_\Omega$ (as shown in the figure), they will collectively provide $N_\Omega P$ correlation values within a time interval $T_{acq}=N_\Omega T_\Omega$, out of which M correlation values will be selected and digitally converted in ADC 550, where at most one correlation value out of P is selected per period $T_s$. It results that here again the correlation values are output at the rate $$\frac{M}{T_{acq}}$$

which can be made arbitrarily close to the Landau rate.

This example of implementation is advantageous in that it entails more diversity than the second example of implementation.

Figure 6:
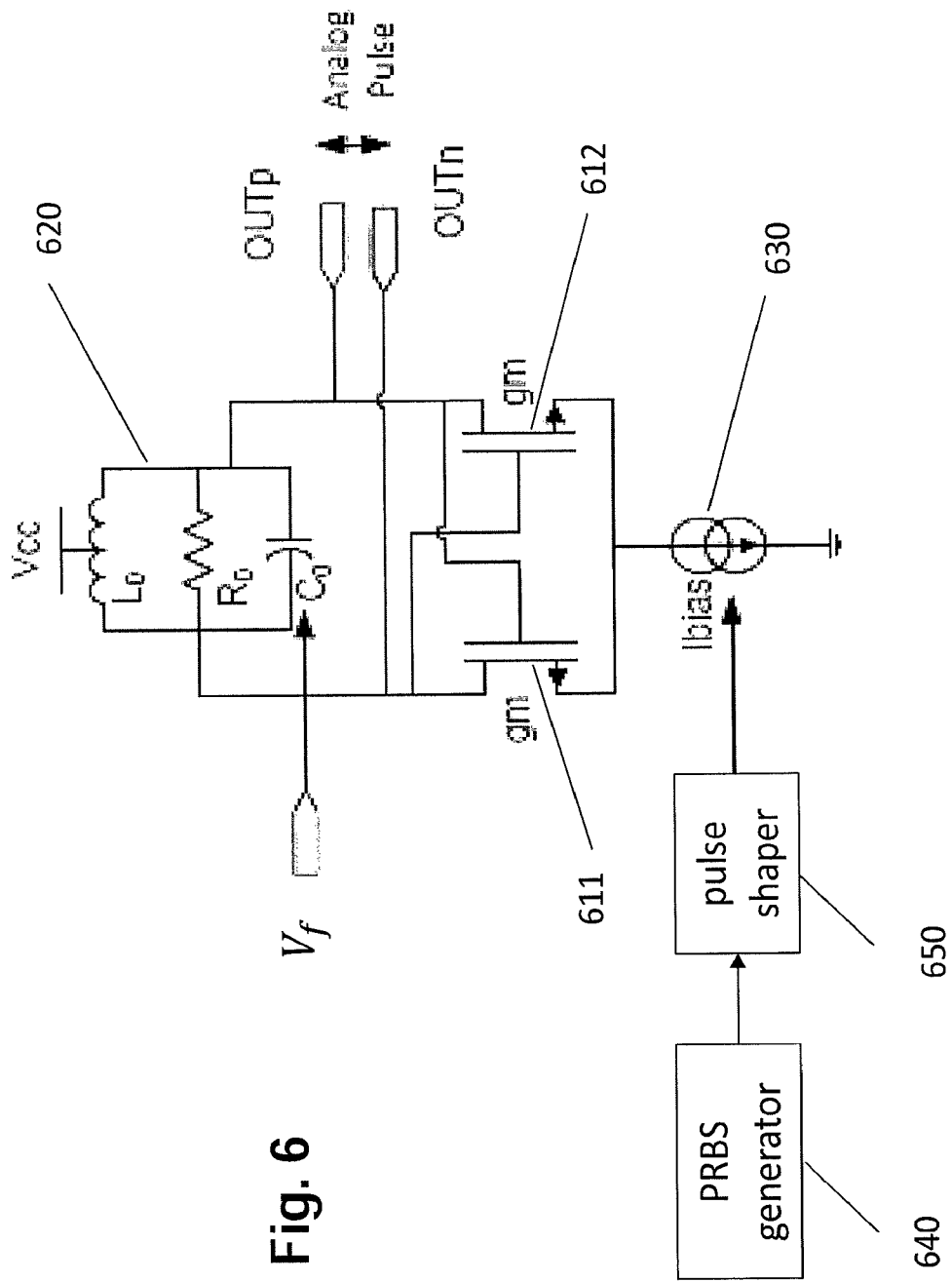
FIG. 6 schematically represents a wavelet generator that can be used for implementing the compressed sensing method according to the invention.

FIG. 6 schematically represents a waveform generator which can be used in a compressed sensing measurement device such as illustrated in FIGS. 5A-5B, in relation with the preferred variant. In particular generators 520 or $520_p$ may be embodied by such a waveform generator.

The waveform generator relies on a cross-coupled Voltage Control Oscillator (VCO). The man skilled in the art will recognize NMOS active cross paired transistors 611 and 612, in parallel with the passive LC tank, 620 that form an oscillator when the power source 630 is activated.

The frequency of the VCO is controlled by the frequency control signal $V_f$. This signal tunes the LC tank to a specific oscillation frequency.

Every clock period $T_s$, if the PRBS generator 640 outputs a logic "1" level, a pulse is generated by the baseband pulse shaper 650, having the desired shape of the waveform. The shaped pulse drives the bias current source $I_{bias}$ so as to provide oscillation during a limited time window defined by the pulse width.

Additional features may be envisaged to further improve the waveform generator.

For example, an additional switch may be provided in parallel to the VCO that creates a shortcut between branches and accelerate oscillation damping. This shortcut avoids any ringing and hangover between pulses.

The waveform generator may be adapted to generate pulse oscillations in quadrature so as to provide complex wavelet. Typically this could be implemented by any QVCO implementation such as doubling frequency, polyphase filtering or combined VCO.

The waveform generator may further comprise means for setting the initial phase of the pulse when starting the oscillation. This could be implemented by providing an unbalance or mismatch between the two branches, that will force oscillation starting in one direction, for example by using NMOS transistors having different W/L ratios.

In the compressed sensing method of FIG. 3, prior knowledge of the band boundaries of the K-sparse multi-band signal of interest x(t) has been assumed. If these band boundaries are not known, they can be recovered by a compressive binary search CBS method associated with wavelet projection at different scales as shown in FIG. 7.

Figure 7:
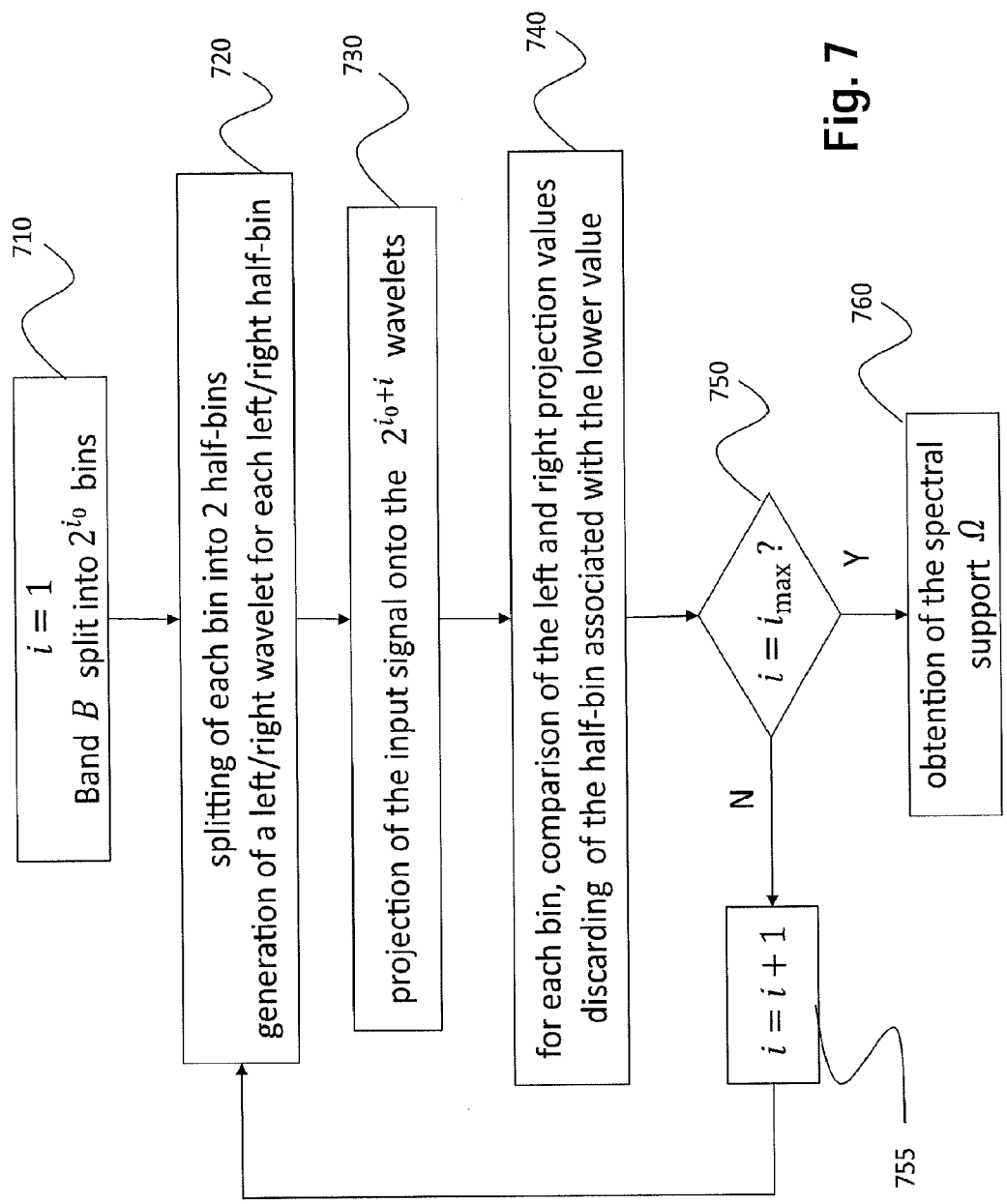
FIG. 7 schematically illustrates the flowchart of a method of spectral support recovery for determining band boundaries of a multi-band signal.

FIG. 7 schematically illustrates the flow chart of a method of spectral support recovery for determining band boundaries of a multi-band signal.

The method performs a search by dichotomy through the bandwidth of the signal. Basically, the method goes through a series of iterations, the bandwidth being split into $2^{i+i_0}$ at the $i^{th}$ iteration, where $i_0$ indicates the initial resolution of the search, $$\frac{B}{2^{i_0}}.$$

The method starts at step 710, with a band B split into $2^{i_0}$ bins of width $$\frac{B}{2^{i_0}}.$$

The index i is initialized i=1.

At step 720, each bin is split into two half-bins of width $$\frac{B}{2^{i_0+1}}:$$

a lower (or left) half-bin and an upper (or right) half-bin. Two wavelets are associated with each half-bin, a left wavelet with a central frequency corresponding to the center of the left half-bin and a right wavelet with a central frequency corresponding to the center of the right half-bin. The left and right wavelets have the same scale which corresponds to the width of the half-bin, i.e.

$$\frac{B}{2^{i_0+1}}.$$

At step 730, the signal is projected onto the $2^{i_0+i}$ wavelets, thereby obtaining for each bin a left projection value on the left-wavelet and a right projection value on the right-wavelet.

At step 740, for each bin, the left and the right projection values are compared to each other. The half-bin corresponding to the higher projection value is retained while the half-bin corresponding to the lower projection value is discarded.

The process of bin splitting and projection onto left/right wavelet goes on until a predetermined granularity is reached, i.e. until the size of the bins lies below a predetermined value.

At step 750, it is checked whether $i=i_{max}$ corresponding to the desired resolution level. If it is not the case, the value i is incremented in 755 and the process loops back at 720. If the desired resolution level has been reached, the process continues with step 760 and ends.

The bins that have not been discarded are considered to contain the non-zero components. In other words, as shown in 760, the union of these bins corresponds to the spectral support Ω of the input signal. It is then straightforward to determine the boundaries of the bands present in the spectrum.

The input signal analyzed in the example shown in FIG. 7 is assumed be K=2 sparse. The method starts at $i_0=1$, that is with bins of width B/2, each bin being split into two half-bins of width B/2. The circled crosses correspond to half-bins that have been tested and the disk shaped points correspond to half-bins that have been tested and retained. Hence, at the first iteration the half-bins $$\left[\frac{B}{4}, \frac{B}{2}\right]$$

and $$\left[\frac{B}{2}, \frac{3B}{4}\right]$$

are retained. These half-bins are used as bins at the next iteration. At the second iteration, the half-bins $$\left[\frac{3B}{8}, \frac{B}{2}\right]$$

and $$\left[\frac{5B}{8}, \frac{3B}{4}\right]$$

are retained. The process goes on with scales of increased values until a predetermined resolution level (here $$\frac{B}{2^7}$$

has been reached.

This algorithm works well provided the left and right projection values are well separated. However, where a non-zero spectral component falls at edge of an half-bin there is a risk that the projections values are close to each other, within the noise margin. Hence an incorrect half-bin may be selected and the subsequent iteration will not be able to recover this component.

This ambiguity at the edges of the bins can be eliminated for a real signal. Indeed, in such a case, the Fourier transform of the signal is Hermitian symmetric, that is the spectrum is conjugate symmetric and therefore the support is identical at both ends of the spectrum. To get rid of this ambiguity, it is proposed to introduce a frequency offset in the complex wavelets central frequencies (e.g. C-Morlet wavelets). As a result, the distribution of a wavelet in a (half-)bin is not symmetric anymore. Hence, a non-zero frequency component giving rise to equal values at the edge of a bin at one end of the spectrum gives rise to unequal values at the other end of the spectrum. It is therefore possible to determine unambiguously the (half-) bin where the non-zero component falls into.

The invention claimed is:

1. A compressed sensing method for compressed sensing a K-sparse signal, the spectrum of which comprising a plurality ($N_b$) of bands, said method comprising:
projecting the signal onto a plurality $N_\Omega$ of waveforms succeeding one another at a bandpass sampling rate of the signal $f_\Omega = \lambda(\Omega)$ where Ω is the spectral support of the signal and λ(.) is the Lebesgue measure, to produce a plurality $N_\Omega$ of projection values, the waveforms belonging to a dictionary, the parameters of the waveforms depending upon the characteristics of the bands of the signal;
sampling the projection values non-uniformly in time, $M < N_\Omega$ projection values being selected at random among $N_\Omega$ projection values, to provide a compressed representation of the signal.

2. The compressed sensing method according to claim 1, wherein the pulse width of the waveforms is chosen shorter than the inverse of an aggregated bandwidth of the signal, the aggregated bandwidth being defined as the sum of the bandwidths of the respective bands of the signal.

3. The compressed sensing method according to claim 1, wherein the $N_\Omega$ waveforms are selected from the waveforms of the dictionary such that the mutual coherence between sampling matrix and inverse Fourier transform matrix restricted to the spectral support of the signal is minimal.

4. The compressed sensing method according to claim 3, wherein the $N_\Omega$ waveforms are such that the ratio between the waveform bandwidth and an aggregated bandwidth of the signal is higher than 50%, the aggregated bandwidth being defined as the sum of the bandwidths of the bands of the signal.

5. The compressed sensing method according to claim 3, wherein the $N_\Omega$ waveforms are distributed among a plurality of sets, each set being associated with a band of the plurality of bands.

6. The compressed sensing method according to claim 5, wherein the $N_\Omega$ waveforms form a sequence at the bandpass sampling rate, the waveforms belonging to a set associated with a band $B_i$ of the signal recurring at a period $$\frac{B_{agg}^w}{B_i^w} T_\Omega$$

where $B_i^w$ is the width of band $B_i$, $B_{agg}^w$ is an aggregated bandwidth, defined as the sum of the bandwidths of the bands of the signal, and $T_\Omega$ is the inverse of the bandpass sampling rate.

7. The compressed sensing method according to claim 5, wherein the $N_\Omega$ waveforms are distributed over a plurality P of subsequences, each subsequence being formed by waveforms succeeding one another at one $P^{th}$ of the bandpass sampling rate, the signal being projected in P parallel branches on said plurality P of subsequences.

8. The compressed sensing method according to claim 5, wherein the $N_\Omega$ waveforms are distributed over a plurality P of subsequences, each subsequence being formed by waveforms having the same parameters and succeeding one another at a rate higher or equal to one $P^{th}$ of the bandpass sampling rate, the signal being projected in P parallel branches on said plurality P of subsequences.

9. The compressed sensing method according to claim 1, wherein the waveforms are Gabor waveforms.

10. The compressed sensing method according to claim 1, wherein the waveforms are Morlet or C-Morlet wavelets.

11. The compressed sensing method according to claim 1, wherein the waveforms are Haar wavelets.

12. The compressed sensing method according to claim 1, wherein the selection of a projection value at a given time is performed according to a logical value output by a pseudo-random generator at that time.

13. The compressed sensing method according to claim 1, wherein, prior to projecting the signal onto the plurality of waveforms, K non-zero components of the sparse signal are searched by an iterative process, starting with a plurality of frequency bins covering the signal spectrum, each iteration step comprising a division of each frequency bin into a first frequency half-bin of lower frequency and a second frequency half-bin of higher frequency, a first wavelet being associated with the first half-bin and a second wavelet being associated with the second half-bin, the signal being then projected onto the first and the second wavelets to obtain a first projection value and a second projection value, the first and second values being compared to each other, and only the half-bin corresponding to the higher value being retained for the next iteration step.

14. The compressed sensing method according to claim 13, wherein, at each iteration step, the first wavelet is centered on the center of the first half-bin and the second wavelet is centered on the center of the second half-bin.

15. The compressed sensing method according to claim 14, wherein the iteration process is carried out until the size of the frequency bins reaches a predetermined value, the support of the spectral spectrum being formed by the frequency bins retained at the last iteration step, the bands of the signal spectrum being derived from this support.

16. The compressed sensing method according to claim 13, wherein, the signal being real, the first wavelet is centered on a first frequency shifted from the center of the first half-bin by a predetermined frequency shift, and the second wavelet is centered on a second frequency shifted from the center of the second half-bin by said predetermined frequency shift, and if the first and second values in a frequency bin are close to each other within a given margin, the corresponding first and second values obtained for the symmetric bin are also compared to determine whether the first-half or second-half bin is retained.

\* \* \* \* \*